United States Patent

Kikuchi

[11] Patent Number: 6,058,047
[45] Date of Patent: May 2, 2000

[54] SEMICONDUCTOR MEMORY DEVICE HAVING ERROR DETECTION AND CORRECTION

[75] Inventor: Shuichi Kikuchi, Esashi, Japan

[73] Assignee: Tokyo Electron Limited, Tokyo, Japan

[21] Appl. No.: 09/051,094

[22] PCT Filed: Aug. 8, 1997

[86] PCT No.: PCT/JP97/02779

§ 371 Date: Apr. 14, 1998

§ 102(e) Date: Apr. 14, 1998

[87] PCT Pub. No.: WO98/08166

PCT Pub. Date: Feb. 26, 1998

[30] Foreign Application Priority Data

Aug. 16, 1996 [JP] Japan ................................. 8-234682

[51] Int. Cl.[7] ................................................ G11C 16/04
[52] U.S. Cl. ............... 365/185.33; 365/241; 365/230.03; 365/200
[58] Field of Search ...................... 365/7, 241, 185.33, 365/200, 185.04, 230.03; 364/200; 360/77.08; 369/44.27; 371/40.11; 395/430

[56] References Cited

U.S. PATENT DOCUMENTS

| | | | |
|---|---|---|---|
| 4,959,774 | 9/1990 | Davis | 364/200 |
| 5,524,230 | 6/1996 | Sakaue et al. | 395/430 |
| 5,644,539 | 7/1997 | Yamagami et al. | 365/200 |
| 5,724,285 | 3/1998 | Shinohara | 365/185.25 |
| 5,802,551 | 9/1998 | Komatsu et al. | 395/430 |

OTHER PUBLICATIONS

Toshiba Nand E²PROM, TC5816FT–1, 9 pages, May 9, 1994.

Primary Examiner—David Nelms
Assistant Examiner—Thong Le
Attorney, Agent, or Firm—Oblon, Spivak, McClelland, Maier & Neustadt, P.C.

[57] ABSTRACT

A semiconductor memory device including a semiconductor memory having a memory region divided into a plurality of blocks including backup blocks, the number of writes to each block being limited, and a memory controller for reading data from the semiconductor memory so as to check an error in the data read from each block, and correcting the error if it is correctable. The memory controller includes a counter for counting the number of correctable errors detected for each block, transferring the data of the corresponding block to the backup block when the number of errors detected reaches a preset value, and inhibiting re-use of the block regarding it as that the life time of the block is almost over.

20 Claims, 5 Drawing Sheets

FIG. 1

| | DATA REGION | | | | | | REDUNDANT | | |
|---|---|---|---|---|---|---|---|---|---|
| | | | | | | | FIRST REGION | SECOND REGION | THIRD REGION |
| A0 | | | | | | | ECC | COUNT VALUE | GOOD-NO-GOOD IDENTIFICATION DATA |
| A1 | | | | | | | ECC | COUNT VALUE | GOOD-NO-GOOD IDENTIFICATION DATA |
| A2 | | | | | | | ECC | COUNT VALUE | GOOD-NO-GOOD IDENTIFICATION DATA |
| A3 | | | | | | | ECC | COUNT VALUE | GOOD-NO-GOOD IDENTIFICATION DATA |
| ... | ... | | | | | | ... | ... | ... |
| A15999 | | | | | | | ECC | COUNT VALUE | GOOD-NO-GOOD IDENTIFICATION DATA |
| A16000 | | | | | | | | | |
| A16001 | | | | | | | | | |
| ... | | | | | | | | | |

SEMICONDUCTOR MEMORY DEVICE HAVING ERROR DETECTION AND CORRECTION

TECHNICAL FIELD

The present invention relates to a semiconductor memory device including a semiconductor memory in which a memory area thereof is divided into a plurality of blocks, the number of times data can be written to each block being limited, and a memory controller for detecting an error in data read out from each block, and correcting the data in the case where correctable error is detected and a method for reading data from and writing data in the semiconductor memory device.

BACKGROUND ART

There has been a trial in which a semiconductor hard disk is used in place of a mechanical hard disk. The mechanical hard disk is advantageous in terms of cost and capacity, whereas the semiconductor hard disk is superior in terms of speed, power consumption, impact resistance, resistance to vibration, weight, size and noise. There have been studies of using a DRAM or SRAM as a semiconductor hard disk; however, more recently, the flash memory (EEPROM: Electrically Erasable Programmable ROM) is becoming more popular. This is because the flash memory entails some advantages, namely, it does not require a battery backup, the element structure thereof is simple, thus making it possible to increase the degree of integration, and the flash memory can be mass-produced at low cost.

The flash memory is a batch erasable and electrically rewritable element; therefore data cannot be over-written thereon, and data cannot be written in a block unless previously-written data are erased therefrom. For example, the writing is performed by 264 to 528 bytes per unit, whereas the erasing is performed by 528 bytes to 64 k bytes per unit. Further, in connection with the flash memory, the number of rewrite operations (the number of erase and write operations) for each block is limited. Therefore, a backup memory area is prepared in addition to the main memory area, and when the life of a block in the main memory area is over (that is, posterior defective), the re-use of the block is inhibited, and a backup block in the backup memory area is used in place of the block.

Each block includes a data region in which data is written and a redundant region in which information indicating the quality of the block, and administrative information such as ECC (error correcting code), used for detecting and correcting an error occurred in data, are written. The ECC is used for such a purpose that a 1-bit error is detected and the error bit is corrected, and 2-bit error is only detected. The block in which a 2-bit error has occurred, is designated as a defective block, and the re-use thereof is inhibited. Then, a backup block is used for substitution.

In a case of whether or not a write of data into the flash memory has been successful, is checked, data in the data bus is rewritten in a backup block even when a 2-bit error has been occurred. However, in the case where the host computer reads data in the flash memory, such a bit error which cannot be corrected disables the read out of data, causing the loss of the data. Therefore, such an error is fatal to the semiconductor disk. In order to avoid this, it is necessary, before an error which cannot be corrected occurs in a block, to inhibit the re-use of the block and carry out the substitution process.

According to a conventional method, the number of data writing times is stored in the redundant region of a block, and when the number reaches a preset value, the block is handled as a defective block.

Although the allowable number of data writing times into block may differ from one IC maker to another, it should be about 100,000 times to 1,000,000 times, and therefore a memory of 3 bytes is required so as to have the count value of data writing times in the redundant region. The redundant region contains the ECC of data and code indicating the quality of the block, which occupy the most of the region, and therefore an extra 3-byte memory is a very serious loss of the region for the redundant region which is very precious. It may even cause an increase in cost. Further, each time data is written, the count of data writing times is read and the count is updated. Therefore, the data writing speed is lowered. Furthermore, if a certain allowable number of data writing times, which is specified by the maker, is set uniformly to all the blocks, a block which is not actually deteriorated (that is, still fully writable or readable) may be substituted, thus decreasing the efficiency in the use of the device.

The object of the present invention is to provide a semiconductor memory device which can prevent the loss of data, and suppress the consumption of the area of a block in the semiconductor memory.

DISCLOSURE OF THE INVENTION

The present invention provides a semiconductor memory device comprising a semiconductor memory having a memory region divided into a plurality of blocks including backup blocks, the number of times data can be written to each block being limited, and a memory controller for reading data from the semiconductor memory so as to check an error in the data read from each block, and correcting the error if it is correctable, in which the memory controller includes a counter for counting the number of correctable errors detected for each block, transferring the data of the corresponding block to the backup block when the number of errors detected reaches a preset value, and inhibiting re-use of the block regarding it as a defective block.

In order to monitor whether or not the number of correctable errors detected reached a preset value, for each block, it is also possible that a count which corresponds to the number of correctable errors detected is stored in a block of the semiconductor memory, and the count is monitored. In this case, it suffices if the memory controller is provided with an updating unit for updating the count value for each time a correctable error is detected in data written in a block, and an inhibiting unit which monitors whether or not the count reached a preset value, and if so, transfers the data to the backup block and inhibits the re-use of the block as a defective block.

BRIEF DESCRIPTION OF THE DRAWINGS

FIG. 1 is an explanatory diagram conceptualizing the structure of a flash memory used in an embodiment of the present invention;

BEST MODE OF CARRYING OUT THE INVENTION

Figure 2:
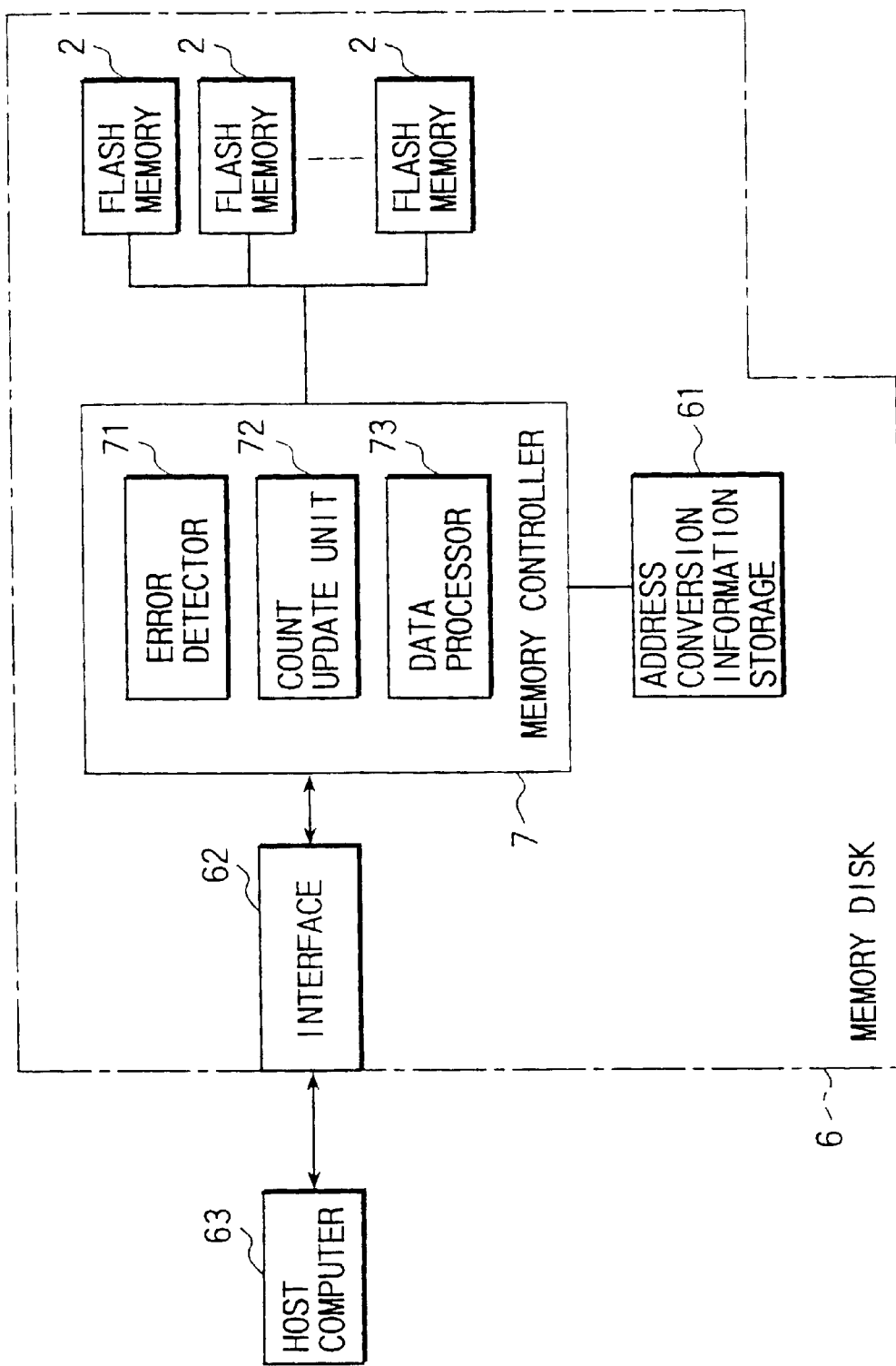
FIG. 2 is a block diagram illustrating the hardware structure of a semiconductor memory according to the embodiment of the present invention.

A semiconductor memory device according to an embodiment of the present invention will now be described. The semiconductor memory device employs a flash memory as its semiconductor memory. As can be seen in FIG. 1, a flash memory 2 is divided into a plurality of blocks 3, and includes a main controller, that is, for example, a main memory area 31 including a good block to which a logical address managed by the host computer, is assigned, and a backup memory area 33 including backup blocks 32 each used as a substitution for a good block of the main memory area 31. Reference symbols starting with letter A, which are provided on the left sides of blocks, A0, A1, . . . , are physical addresses.

Each block 3 has a data region 4 in which data can be written and a redundant region 5 in which the management information of the block is written. The redundant region 5 further includes a first region 51 in which an ECC corresponding to the data written in the data region 4, can be written, a second region 52 serving as a count storage region for storing the count value corresponding to the number of 1-bit errors detected when data written in the block 3 are read, and a third region 53 for storing identification information as to whether the block 3 is good or no-good.

The entire memory structure of the semiconductor memory device will now be described with reference to FIG. 2. A memory disk 6 is equivalent to a semiconductor memory device, and contains a plurality of flash memories 2 each having the above-described structure, a memory controller 7 for controlling the memories, and an address conversion information storage 61, constituted by, for example, RAM, for storing information required for address-conversion between the logical address managed by the main controller and the physical address managed by a flash memory 2. The memory controller 7 is connected via an interface 62 to the host computer 63 serving as a main controller.

The memory controller 7 includes, in terms of a functional block, an error detector 71, a count update unit 72 and a data processor 73. The error detector 71 reads out an ECC corresponding to data, stored in the first region 51, when reading out data written in the block 3 of a flash memory 2, and compares this ECC with another ECC prepared on the basis of the data read out, so as to check if there is any error in the read data. Further, the error detector 71, when a 1-bit error is detected, corrects the read data and instructs to the count update unit 72 to update the count, whereas, when a 2-bit or higher-bit error is detected, it instructs the data processor 73 to carry out a substitution process.

The count update unit 72, upon receiving the instruction for updating the count from the error detector 71, for example, counts down the count of the second region 52 of the block 3 in which a 1-bit error is detected. The data processor 73 writes data sent from the host computer 62, in a physical block 3 of the flash memory 2, which corresponds to the logical address of the data with reference to data stored in, for example, address conversion information storage unit 61, and read the data in the flash memory 2, which corresponds to the logical address designated by the host computer 63, to be sent to the host computer 63.

Further, the data processor 73 judges whether or not the count value reaches a preset value when the count of the block 3 is updated by the count update unit 72. If it is judged that the count reached the preset value, the processor 73 transfers the data in the block 3 into the data region of the backup block 32 of the backup memory region 33, and changes the good/no-good identification information of the third region 53 of the block 3 to information indicating a no-good block, so as to inhibit the re-use of the block.

For example, the preset value for the count is set to 10. In this case, the initial value of the count is set to "9", and when the value is counted down ten times to "0", the re-use of the block is inhibited. As the quality identification information, for example, a flag of "1" is assigned to a good block, and a block without such a flag is handled as a no-good block.

Figure 3:
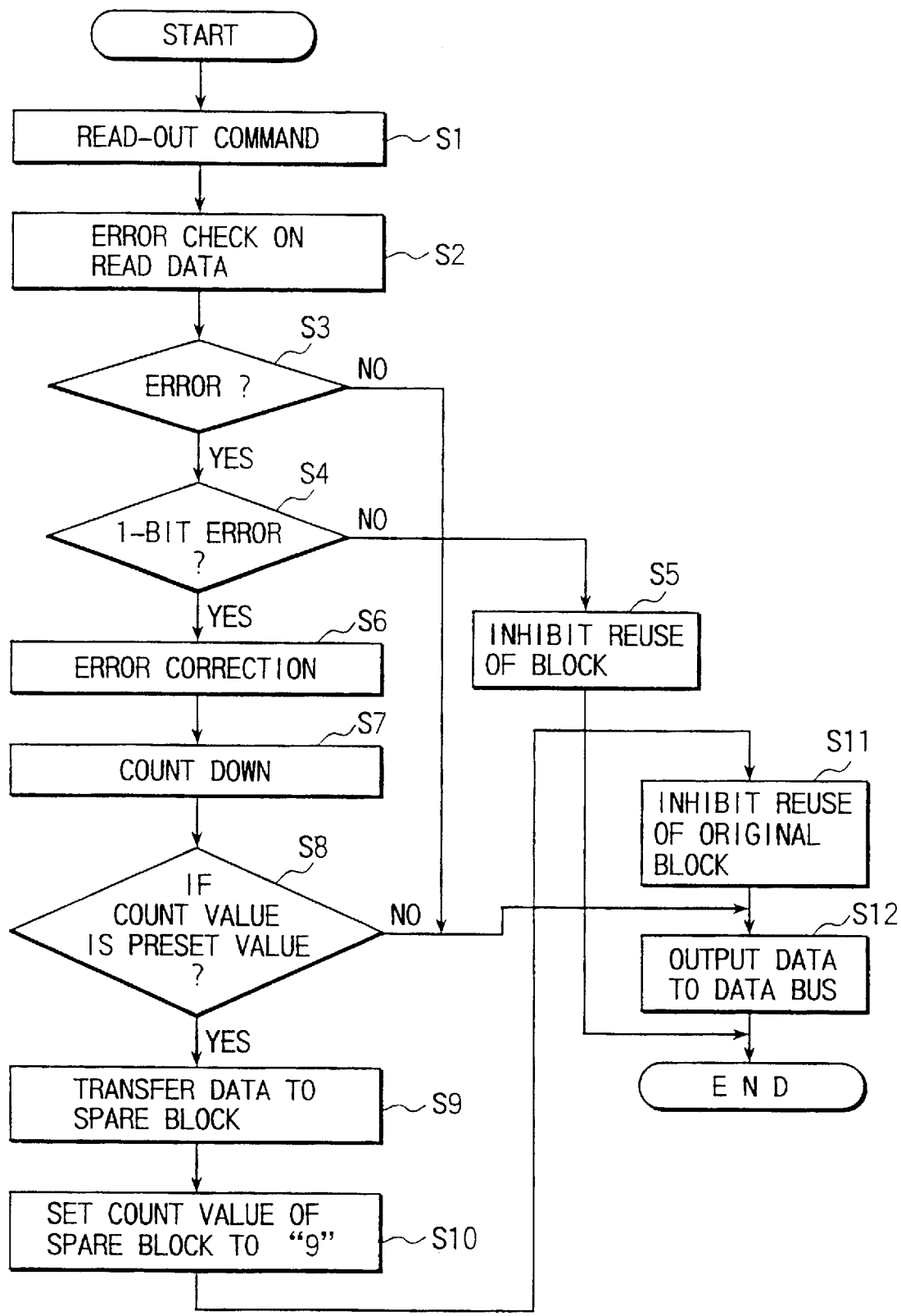
FIG. 3 is a flowchart illustrating the operation of read-out of data in the embodiment.

Next, the operation of the semiconductor memory device of the embodiment will now be described with reference to the flowchart shown in FIG. 3.

First, let us suppose that the count of the second region of each block is set in advance to an initial value of "9", and an instruction for reading data in the flash memory 2 is given to the memory controller 7 from the host computer 63 (Step S1). Then, the data processor 73 of the memory controller 7 reads data of the physical address, which corresponds to the read instruction, from the flash memory 2, and the error detector 71 carries out an error check operation on the read data on the basis of the ECC (Step S2). More specifically, the ECC of the read data and the other ECC assigned to the written data when it is written are compared with each other, so as to check an error of the read data.

The data is judged as to whether or not it contains an error (Step 3). When there is no error, the process proceeds to the Step 12, where the read data is output to the data bus. If there is an error, the error is judged as to whether or not it is correctable, that is, for example, it is a 1-bit error or not (Step 4). If there is a bit error which cannot be corrected, for example, a 2-bit error, the flag "1" of the quality identification information of the third region of the block is erased, and the re-sue of the block is inhibited as a defective block (Step S5).

In the case where the error found is a 1-bit type, the process proceeds to Step S6, where the count value of the second region of the block is updated by, for example, counting it down (Step S7). Subsequently, it is judged if the count value after the countdown reached the preset value (Step S8). When the count value is not yet the preset value, that is, in this case, when the count is not yet "0", the block is judged that the life thereof is not yet finished. Therefore, the use of the block is not inhibited, and the data is output to the data bus. On the other hand, when the count value is already the preset value, that is, "0", the block is judged that the life thereof is almost over. Therefore, the data is transferred to a backup block 32 of the backup memory region 33 by, for example, copying (Step S9), and the count of the second region of the backup block 32 is set to an initial value, that is, "9" (Step S10).

After that, the flag "1", which indicates a good block, of the quality identification information in the third region of the original block, is erased, so as to inhibit the re-use of the block (Step S11). At the same time, the data read out is output to the data bus.

Figure 4:
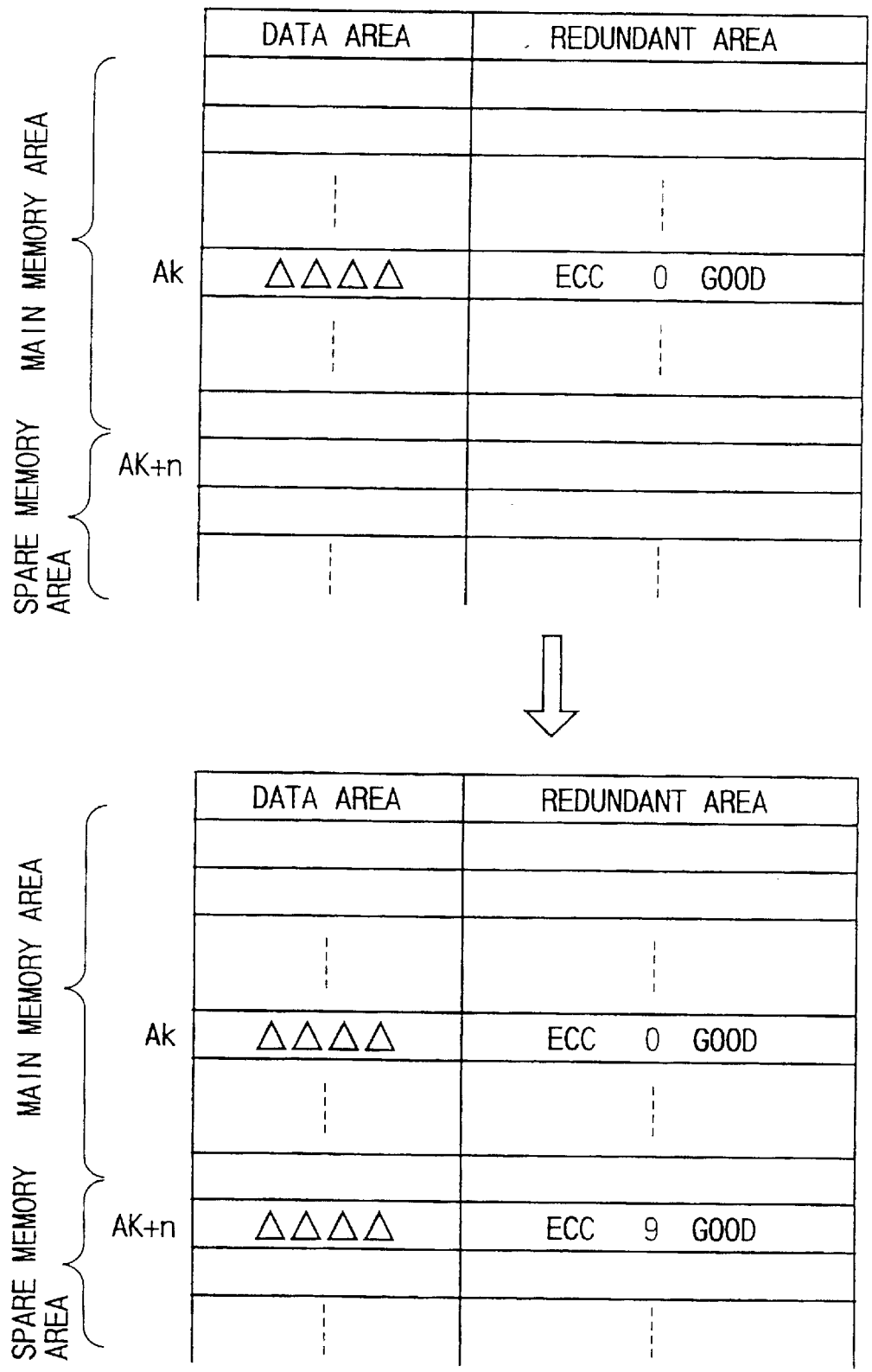
FIG. 4 an explanatory diagram illustrating that an error occurred in data while reading it and the substitution of the block is carried out.

FIG. 4 is a diagram illustrating that data is read from a block having a physical address of Ak, and a 1-bit error occurred while the count becoming "0"; therefore the data is transferred to a backup block having a physical address of Ak+n.

In the above-described embodiment, by focusing on the fact that the occurrence rate of the bit error of the block 3 of the flash memory 2 increases as the number of data writing times increases, the state in which a correctable bit error, is estimated, that is, the life of the block 3 is estimated on the basis of the number of occurrence of a 1-bit error, and the block is replaced by a substitute backup block 32. With this operation, the block 3 is substituted by another before an error which cannot be corrected, occurs therein, and therefore the data in the block is not lost. Further, as compared to the case where the number of allowable data writing times is set uniformly to all blocks, blocks can be subjected to the substitution process for the life time of each and individual block, and therefore the memory use efficiency becomes high.

Moreover, it is sufficient if the memory region (the second region 52) for the count, prepared in the redundant region 5 of the block 3, can store the count which corresponds to the number of errors, that is, "9" in the above embodiment, and therefore the number of bytes may only be, for example, 1 byte. Thus, such data does not occupy a large area in the redundant region 5, which is very precious, and the consumption of the region can be suppressed. Consequently, it is possible to increase the error correction function by using a still remaining area of the redundant region 5, which was saved by the above operation. Further, the count is updated when a correctable error, namely, 1-bit error, occurred when reading the data. Since the frequency of the occurrence of such an error is low, the time duration required to write or read data with respect to the flash memory 2, is not substantially affected.

As an alternative version to the above-described embodiment, the following operation is also possible. That is, the count of the number of errors detected, may be updated as follows. Specifically, data is written in the flash memory 2 upon receiving an instruction for writing data from the host computer 62, and immediately after the data writing, the data is read so as to check an error. Thus, it is judged as to whether the data was written appropriately in the flash memory, and the count is updated when an error is detected during this operation.

Furthermore, the count may be updated by counting-up operation. In this case, the initial value of the count value is set to, for example, "0", and when the value is counted up to, for example, "9", a corresponding block is substituted by another, and the quality identification information of the block is erased.

Further, the location where the count value is stored is not limited to the redundant region of a block, but it is also possible that the count is stored in a separate table which is provided in the data region, and the count in the table is monitored. Also, the backup memory region may not be provided in the flash memory in which the main memory region is also provided, but another flash memory may be prepared to be used exclusively as a backup memory. More specifically, a parallel process in which data in one flash memory is erased, whereas data is written in another flash memory, may be carried out so as to increase the speed of the data writing operation.

It should be noted that the semiconductor memory is not limited to the flash memory, but it may be some other type as long as it is capable of limiting the number of data writing times for each block.

As described above, according to the semiconductor memory device of the present invention, it is possible to prevent the loss of data and suppress the consumption of the region of a block in a semiconductor memory.

Figure 5:
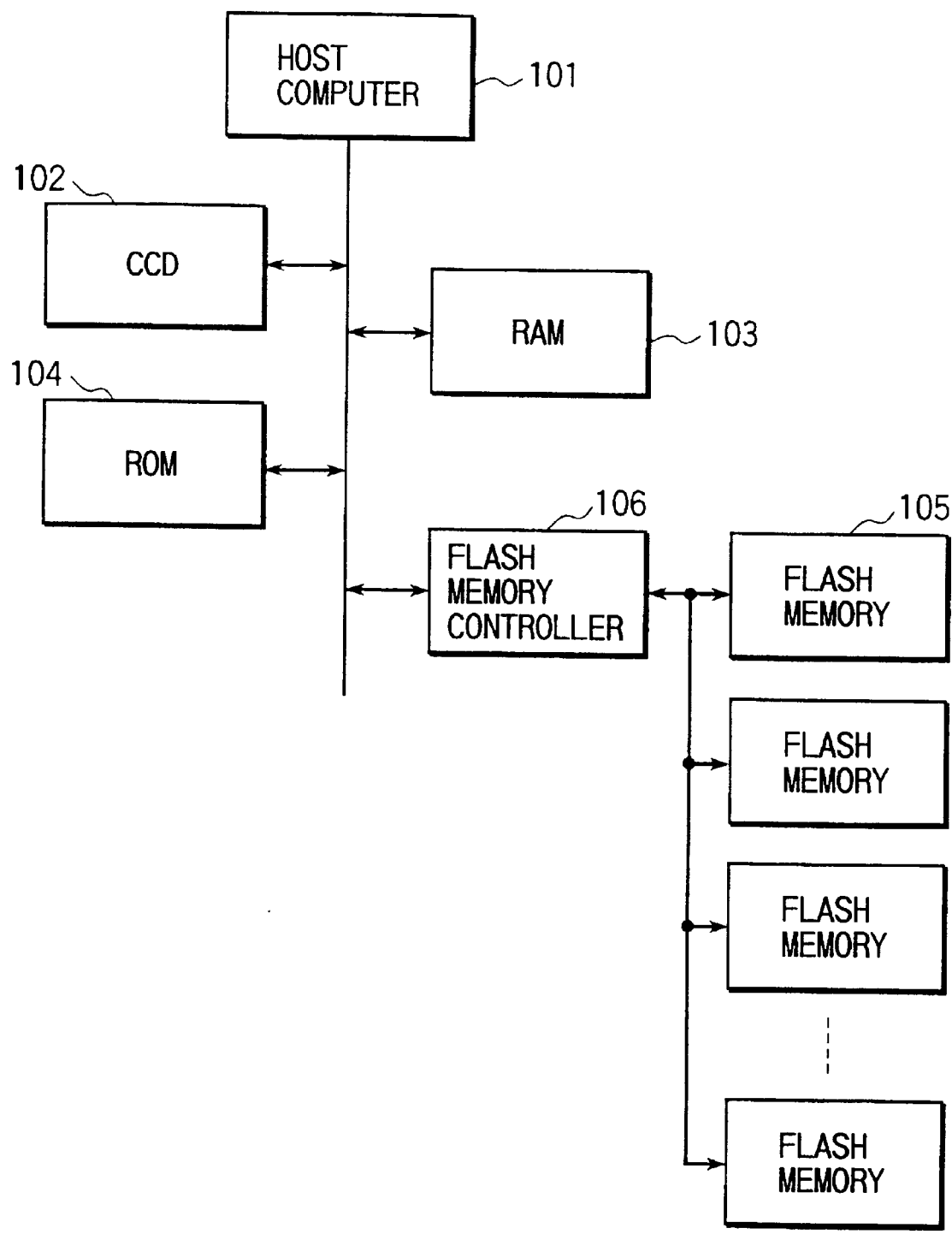
FIG. 5 is a block diagram of an electronic camera to which the present invention is applied.

FIG. 5 is a block circuit diagram of an embodiment in which the present invention is applied to en electronic camera. In this embodiment, a host computer 101 is provided to control the overall operation of the electronic camera, and the host computer is connected to a CCD 102 serving as an image pickup element, a RAM 103, a ROM 104 and a flash memory controller 106 for controlling a plurality of flash memories 105 each for storing image data. The flash memory controller 106 stores a sequence for executing the process illustrated in FIG. 3, and the reading/writing operation of data for the flash memories 105 is controlled in accordance with the sequence.

What is claimed is:

1. A semiconductor memory device comprising:
    a semiconductor memory having a memory region divided into a plurality of blocks including backup blocks, the number of times data is written to each block being limited; and
    a memory controller for reading data from the semiconductor memory, performing an error check of the read data for each block, and correcting only the error detected by the error check of the read data if it is correctable, said memory controller including means for counting the number of correctable errors detected for each block, transferring the data of the corresponding block to the backup blocks when the number of errors detected reaches a preset value, and inhibiting re-use of the block regarding it as a defective block.

2. The semiconductor memory device according to claim 1, wherein said semiconductor memory includes a plurality of flash memories having a plurality of main blocks each storing data to be error-checked by said memory controller, and said backup blocks.

3. The semiconductor memory device according to claim 2, wherein each of said plurality of blocks includes a data region in which data is written, and a redundant region in which management information is written, said redundant region having a first region in which an ECC corresponding to the data written in said data region, is written, a second region for storing a count corresponding to the number of 1-bit errors detected when reading the data written in said block, and a third region for storing identification information for identifying if said block is good.

4. The semiconductor memory device according to claim 3, wherein said memory controller checks if an error is contained in the data on the basis of the ECC stored in said first region, and updates the count of said second region for each time a 1-bit error is detected.

5. The semiconductor memory device according to claim 4, wherein said memory controller sets an initial value which corresponds to a life time, in said second region, and updates the count by counting it clown.

6. The semiconductor memory device according to claim 3, wherein said controller, when the count is updated and it reaches the preset value, transfers the data in said block to the data region of at least one of the backup blocks, and erases the identification information of said third region of said block in order to inhibit further use of said block.

7. The semiconductor memory device according to claim 6, wherein said memory controller sets the count of said second region of the at least one of said backup blocks used for the transfer of the data, to an initial value.

8. The semiconductor memory device according to claim 1, wherein said memory controller carries out an error check immediately after writing data in said semiconductor memory, and updates the number of errors detected in response to detection of an error.

9. The semiconductor memory device according to claim 1, wherein said semiconductor memory includes a flash memory used exclusively for the main block and a flash memory used exclusively for said backup blocks.

10. The semiconductor memory device according to claim 1, wherein said semiconductor memory and said memory controller each have at least one flash memory built in an electronic camera, and a memory device storing a program used for controlling the flash memory.

11. A semiconductor memory device comprising:

a semiconductor memory having a memory region divided into a plurality of blocks, the number of times data is written to each block being limited; and a memory controller for reading data from said blocks, error-checking the data read from each block, and correcting only the error detected by the error check of the read data if it is correctable, said each block including account storage region for storing a count corresponding to the number of correctable errors detected regarding the data written in said block, and said memory controller including means for updating the count when a correctable error is detected regarding the data written in a block, and means for monitoring as to whether the count reached a preset value, and when the count reached the preset value, transferring the data to the backup block, and inhibiting re-use of the block regarding it as a defective block.

12. A method of writing/reading data with regard to a semiconductor memory having a memory region divided into a plurality of blocks including backup blocks, the number of times data is written to each block being limited, said method comprising the steps of:

reading data from said semiconductor memory;

performing an error-check on the read data for each block;

counting only the number of correctable errors detected by the error check of the read data, for each block and rewriting the data of a corresponding block to at least one of said backup blocks when the number of errors detected reached a preset value; and inhibiting reuse of said block as a defective block.

13. The method according to claim 12, wherein a plurality of main blocks each having data to be subjected to an error-check, and a plurality of flash memories are used as said semiconductor memory.

14. The method according to claim 13, wherein each of said plurality of blocks is assigned as a date region in which data is written, or a redundant region in which management information is written, and said redundant region is divided into a first region in which an ECC corresponding to the data written in said data region, is written; a second region for storing a count corresponding to the number of 1-bit errors detected when reading the data written in said block; and a third region for storing identification information for identifying if said block is good.

15. The method according to claim 14, wherein said error-check step checks if an error is contained in the data on the basis of the ECC stored in said first region, and updates the count of said second region each time a 1-bit error is detected.

16. The method according to claim 15, wherein said updating step sets an initial value which corresponds to a life time, in said second region, and updates the count by counting it down.

17. The method according to claim 14, wherein said rewriting step rewrites, when the count is updated and it reaches the preset value, the data in said block, to the data region of at least one of the backup blocks, and said erasing step erases the identification information of said third region of said block in order to inhibit further use of said block.

18. The method to claim 17, wherein the count of said second region of the at least one of said backup blocks used for the transfer of the data, is set to an initial value.

19. The method according to claim 12, wherein said error-check step carries out an error check immediately after writing data in said semiconductor memory, and updates the number of errors detected in response to detection of an error.

20. The method according to claim 12, wherein a flash memory used exclusively for the main block and a flash memory used exclusively for said backup block are used as said semiconductor memory.

* * * * *